(12) United States Patent
Hofstra et al.

(10) Patent No.: US 6,411,019 B1
(45) Date of Patent: Jun. 25, 2002

(54) ORGANIC ELECTROLUMINESCENT DEVICE

(75) Inventors: Peter G. Hofstra, Guelph; Alexey Krasnov, Brampton, both of (CA)

(73) Assignee: Luxell Technologies Inc., Mississauga (CA)

( * ) Notice: Subject to any disclaimer, the term of this patent is extended or adjusted under 35 U.S.C. 154(b) by 0 days.

(21) Appl. No.: 09/361,137

(22) Filed: Jul. 27, 1999

(51) Int. Cl.$^7$ ............................................... H05B 33/22
(52) U.S. Cl. ...................... 313/112; 313/502; 313/506; 428/917
(58) Field of Search ................................ 313/112, 502, 313/506; 315/169.3; 428/690, 917; 359/308, 885

(56) References Cited

U.S. PATENT DOCUMENTS

| | | | |
|---|---|---|---|
| 4,396,864 A | * 8/1983 | Suntola et al. ........... | 313/506 X |
| 5,049,780 A | 9/1991 | Hofstra et al. | |
| 5,831,375 A | * 11/1998 | Benson, Jr. ............. | 313/112 X |
| 5,847,506 A | * 12/1998 | Nakayama et al. ..... | 313/506 X |

FOREIGN PATENT DOCUMENTS

| | | | |
|---|---|---|---|
| EP | 0 838 976 A1 | 10/1997 | ........... H05B/33/28 |
| WO | WO 97/38452 | 4/1997 | ........... H01L/51/20 |
| WO | WO 00/35028 | 12/1999 | ........... H01L/51/20 |

OTHER PUBLICATIONS

Parthasarathy et al., A Metal–Free Cathode For Organic Semiconductor Devices, Apr. 27, 1998, American Institute of Physics, vol. 72, No. 17, 2138–2140.

Gyoutoku et al., An Organic Electroluminescent Dot–Matrix Display Using Carbon Underlayer, Synthetic Metals 91 (1997) 73–75.

\* cited by examiner

*Primary Examiner*—Ashok Patel
(74) *Attorney, Agent, or Firm*—Marks & Clerk

(57) ABSTRACT

The present invention provides a novel organic electroluminescent device having an optical interference member which reduces the overall reflectance from the device. The invention is particularly suited to current-driven organic displays having an anode, an electroluminescent layer and a cathode, where at least one optical interference member is placed between two of the layers and thus forms part of the electrical circuit required to excite the display. The optical interference member is chosen to have a thickness which causes at least some destructive optical interference of ambient light incident on the display. In addition, the material(s) of the optical interference member are chosen to have a work function which is compatible with the highest occupied molecular orbital, or the lowest unoccupied molecular orbital of the electroluminescent layer, depending on the location of the optical interference member in relation to the anode, cathode and electroluminescent layer. The appropriate selection of material can ensure proper current flow the device, thus reducing the likelihood of electrical breakdown of the organic electroluminescent layer, and improving the overall energy efficiency of the device.

28 Claims, 1 Drawing Sheet

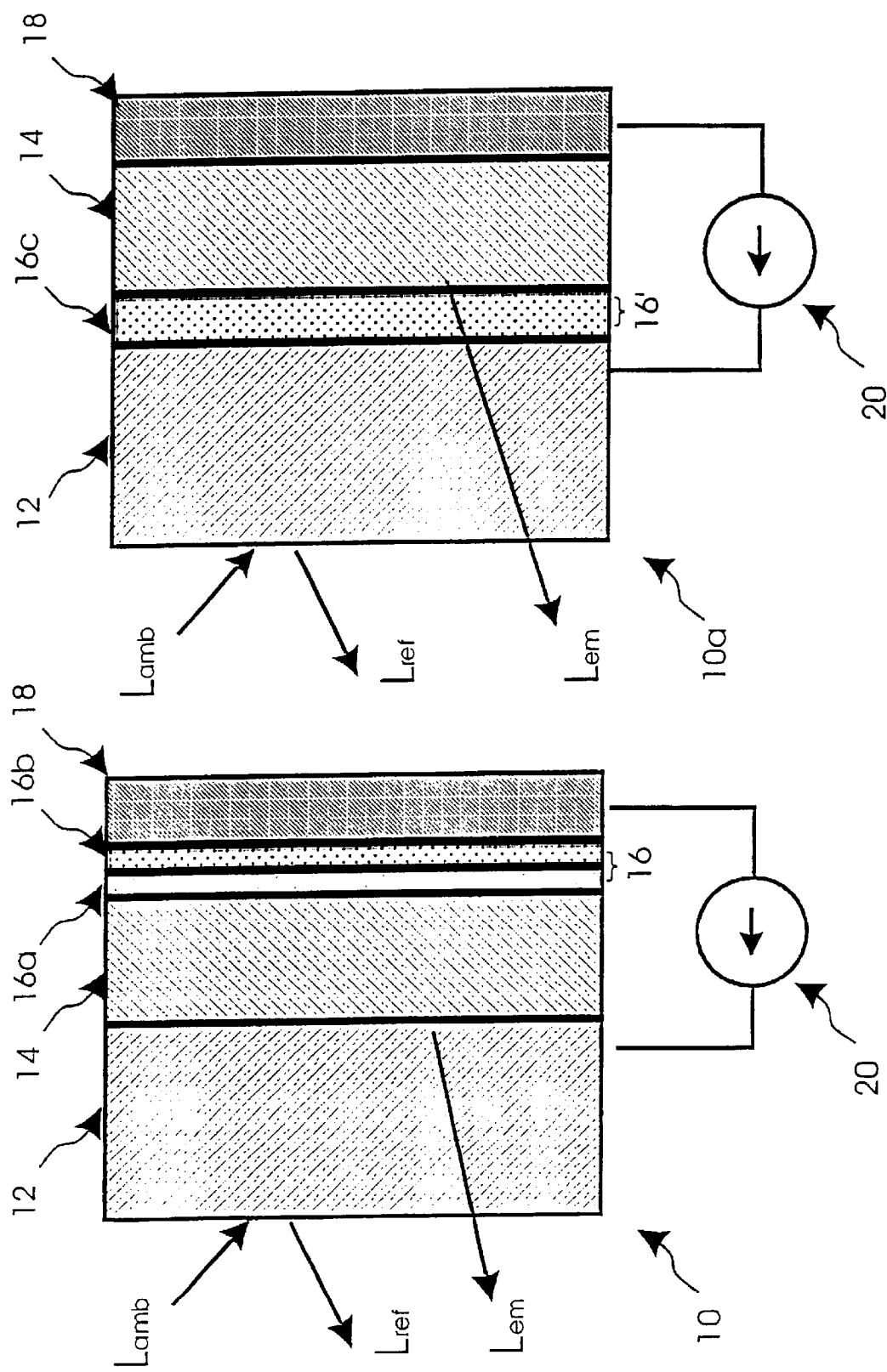

ORGANIC ELECTROLUMINESCENT DEVICE

FIELD OF THE INVENTION

The present invention relates generally electroluminescent devices and more specifically relates to an organic electroluminescent device having a thin film optical interference layer to reduce reflectance from ambient light.

BACKGROUND OF THE INVENTION

Electroluminescent devices (ELDs) are well known and are generally constructed of several layers of different materials. These layers typically consist of a transparent front-electrode layer, an electroluminescent layer and a back-electrode layer. When a voltage is applied across the electrodes, the electroluminescent layer becomes active, converting some portion of the electrical energy passing therethrough into light. This light is then emitted out through the front-electrode, which is transparent to the emitted light, where it is visible to a user of the device.

Electroluminescent devices can be particularly useful as computer displays and are generally recognized as high-quality displays for computers and other electronic devices used in demanding applications such as military, avionics and aerospace where features such as high reliability, low weight, and low power consumption are important. Electroluminescent displays are also gaining recognition for their qualities in automotive, personal computer and other consumer industries, as they can offer certain benefits over other displays such as cathode-ray tubes ("CRT") and liquid crystal displays ("LCD").

One feature of electroluminescent displays is the ability to add thin films between the layers to vary the characteristics of the display. It is known to use thin film layers in electroluminescent displays to improve selected display characteristics, such as signal-to-reflected-ambient light ratio ("SRA") and contrast ratio ("CR"). For greater clarity, signal-to-reflected ambient light ratio can be defined as:

$$SRA = \frac{L_{em}}{R \times L_{amb}}$$

where:
SRA=Signal-to-reflected ambient light ratio
$L_{em}$=Emitted luminance of the device
R=Reflectance of the device
$L_{amb}$=The ambient illuminance, or the ambient light incident on the display and, in a pixilated device, contrast ratio can be defined as:

$$CR = \frac{L_{on} + R \times L_{amb}}{L_{off} + R \times L_{amb}}$$

where:
CR=Contrast Ratio
$L_{on}$=Emitted luminance of active or "on" pixels
$L_{off}$=Emitted luminance of inactive or "off" pixels
R=Reflectance of the device
$L_{amb}$=The ambient illuminance, or the ambient light incident on the display One particular type of thin-film layer that can be used to improve contrast ratio in electroluminescent devices is a substantially transparent optical interference layer placed between one or more of the layers of the electroluminescent device, as taught in U.S. Pat. No. 5,049,780 to Dobrowolski. As will be apparent to those of skill in the art, improvements to the contrast ratio of an electroluminescent device is generally desirable and particularly important in avionics and military applications where poor contrast and glare can have serious consequences. Using the principle of destructive interference, the optical interference layer can result in the reduction of the amplitude of ambient light by superimposing of two or more, out-of-phase, electromagnetic waves, which can be generated by reflection and/or transmission at the interfaces of thin-film layer(s). By selecting appropriate thicknesses of the layers, optical destructive interference at the electromagnetic wavelengths of interest (typically visible ambient light waves reflected off of the display) can result in an exceptional contrast ratio and/or signal-to-reflected ambient light ratio.

Dobrowolski is generally directed to voltage-driven inorganic electroluminescent devices, where the electroluminescent layer is formed of an inorganic material, and which typically require one or more additional transparent dielectric layers to reduce electrical-breakdown of the inorganic electroluminescent layer. Such inorganic electroluminescent devices are typically voltage-driven, powered with alternating current ("ac") in order to reduce charge build-up within the device. While Dobrowolski does generally contemplate the use of direct current ("dc") electroluminescent devices without transparent dielectric layers, such inorganic devices are still voltage-driven, and are generally prone to electrical breakdown of the electroluminescent layer.

With the advent of modern current-driven organic electroluminescent devices which offer certain advantages (such as colour improvements and a reduced barrier to current flow to reduce the necessary drive voltage) compared to voltage-driven inorganic electroluminescent devices, there is now a need to improve the contrast ratio and/or signal to ambient light ratio of these organic devices, and it can be seen that the prior art does not teach a suitable optical interference electroluminescent device to address this need.

SUMMARY OF THE INVENTION

It is therefore an object of the present invention to provide a novel optical interference organic electroluminescent device which obviates or mitigates at least one of the disadvantages of the prior art.

In an embodiment of the invention there is provided an optical interference electroluminescent device for displaying an image to a viewer in front of the device, comprising: an anode layer; a cathode layer, at least one of the anode layer and the cathode layer being substantially transparent to at least a portion of emitted electroluminescent light; at least one organic electroluminescent layer disposed between the anode layer and the cathode layer, the electroluminescent layer having a first energy characteristic being the amount of energy required to extract an electron from a highest occupied molecular orbital of the electroluminescent layer, and a second energy characteristic being the amount of energy required to extract an electron from a lowest unoccupied molecular orbital of the electroluminescent layer; and at least one optical interference member disposed between two of the layers, and having a work function substantially equal to the first energy characteristic when the optical interference member is between the anode and the electroluminescent layer, and having a work function substantially equal to the second energy characteristic when the optical interference member is between the cathode and the electroluminescent layer, the optical interference member being of a thickness and material such that the spectral reflectance of the electroluminescent device is so modified that the reflectance of ambient light by the electroluminescent device towards the viewer is reduced.

In another embodiment of the invention, there is provided an electroluminescent device to emit light in a selected spectrum, comprising: an anode layer, a cathode layer, wherien one of the anode layer and the cathode layer are substantially transparent to at least a portion of the selected spectrum emitted by the electroluminescent device. The electroluminescent device further comprises an organic electroluminescent layer between the anode layer and the cathode layer, the electroluminescent layer having a highest occupied molecular orbital respective to the anode layer and having a lowest unoccupied molecular orbital respective to the cathode layer. The device further includes an optical interference member having a selected work function and operable to reduce ambient light reflected through the transparent layer, the optical interference member being between the electroluminescent layer and one of the anode layer and the cathode layer, wherein the difference between the selected work function and an energy level required to extract an electron from a respective molecular orbital approaches zero.

In another embodiment of the invention, there is provided a method of fabricating an electroluminescent device for displaying an image to a viewer in front of the device, comprising the steps of:

depositing an anode layer onto a substrate;

depositing an organic electroluminescent layer onto the anode layer, the electroluminescent layer having a first energy characteristic associated with an anode side, and a second energy characteristic associated with a cathode side;

depositing an optical interference member onto the electroluminescent layer, the optical interference member for reducing the reflectance of ambient light towards the viewer, the optical interference member having a work function substantially equal to the second energy characteristic;

depositing a cathode layer onto the optical interference member; and sealing the device.

In another embodiment of the invention there is provided a method of assembling an electroluminescent device for displaying an image to a viewer in front of the device, comprising the steps of:

depositing an anode layer onto a substrate;

depositing an optical interference member onto the anode layer; the optical interference member for reducing the reflectance of ambient light towards the viewer, the optical interference member having a work function;

depositing an organic electroluminescent layer onto the anode layer, the electroluminescent layer having an energy characteristic being the amount of energy required to extract an electron from the electroluminescent layer, the energy characteristic being substantially equal to the work function;

depositing a cathode layer onto the electroluminescent layer; and sealing the device.

In another embodiment of the invention, there is provided a method of displaying an image to a viewer comprising the steps of:

emitting light from an organic electroluminescent layer between an anode and a cathode, said electroluminescent layer having a first energy characteristic respective to said anode and a second energy characteristic respective to said cathode; and receiving ambient light incident towards said electroluminescent layer; and forming destructive interference from said ambient light at the incident surface of an optical interference member, said optical interference member having a selected work function and disposed between said electroluminescent layer and one of said anode and said cathode, the difference between said work function and a respective energy characteristic approaching zero.

The appropriate selection of material of the at least one optical interference member ensures proper current flow through the device, thus reducing the likelihood of electrical breakdown of the organic electroluminescent layer, and improving the overall energy efficiency of the device, while still reducing reflectance towards a viewer.

BRIEF DESCRIPTION OF THE DRAWINGS:

The present invention will now be described, by way of example only, with reference to certain embodiments shown in the attached Figures in which:

FIG. 1 is a schematic diagram of a cross-section of through a portion of an optical interference organic electroluminescent device in accordance with a first embodiment of the invention; and FIG. 2 is a schematic diagram of a cross-section of through a portion of an optical interference organic electroluminescent display in accordance with a second embodiment of the invention.

DETAILED DESCRIPTION OF THE INVENTION

Referring now to FIG. 1, an electroluminescent device in accordance with a first embodiment of the invention is indicated generally at 10. Device 10 comprises an electroluminescent transmitting anode 12, an electroluminescent layer 14 disposed behind anode 12, an optical interference member 16 disposed behind the electroluminescent layer 14 and a cathode 18 disposed behind the interference member 16. Device 10 is connected to a current source 20 via anode 12 and cathode 18 in order to drive a constant current through device 10.

Electroluminescent transmitting anode 12 is any conducting material which is transparent to at least a portion of emitted electroluminescent light, such as indium tin oxide (ITO) or zinc oxide (ZnO). In a present embodiment, anode 12 is a layer of indium tin oxide preferably having a thickness of about fifteen-hundred angstroms (1500 Å).

It is to be understood that electroluminescent transmitting anode 12 can have different thicknesses, and can be in the range of, for example, from about one-thousand angstroms (1000 Å) to about three-thousand angstroms (3000 Å), or from about twelve-hundred angstroms (1200 Å) to about two-thousand angstroms (2000 Å).

Electroluminescent layer 14 is an organic electroluminescent material such as tris(8-quinolinolato aluminum) (Alq3) or poly(n-vinyl carbozale) ($PVC_Z$) wherein photons of light are emitted when electrons drop from a lowest unoccupied molecular orbital ("lumo") of layer 14, where they combine with holes in the highest occupied molecular orbital ("homo") of layer 14. Accordingly, a current flow through electroluminescent layer 14 can produce an emission of light. In a present embodiment, layer 14 is preferably made from tris(8-quinolinolato aluminum), preferably having a thickness of about one-thousand angstroms (1000 Å), although those of skill in the art will be able to select other appropriate thicknesses of this layer. As is known to those familiar with the electrical properties of tris(8-quinolinolato aluminum), the energy required to extract an electron from the highest occupied molecular orbital is about 5.4 electron-volts, which can also be described as the energy required to extract an electron from the surface of layer 14, or, the work function $E_{HOMO}$ of layer 14. Further, the energy required to extract an electron from the lowest unoccupied molecular orbital of tris(8-quinolinolato aluminum) is about 3.0 electron-volts, which can be referred to as $E_{LUMO}$. Thus the difference between $E_{HOMO}$ and $E_{LUMO}$ of tris(8-quinolinolato aluminum) is about 2.4 electron-volts. In other embodiments of the invention, other organic materials can be so chosen (i.e. by selection of material or modification of material with dopants) so that the difference between $E_{HOMO}$ and $E_{LUMO}$ is in the range from about 1.5 electron-volts to about 3.0 electron-volts, which covers the spectrum of visible light.

In a present embodiment, optical interference member 16 comprises a semi-absorbent layer 16a and a transparent layer 16b. Semi-absorbent layer 16a is partially reflective, partially absorbing and partially transmissive of light in the visible spectrum, and in a present embodiment, is made from magnesium silver (Mg:Ag) having a thickness of about one-hundred-and-eighty-five angstroms (185 Å). Other suitable materials can include Inconel™, Nickel (Ni), Titanium, or a suitable organic material and appropriate thicknesses of such layers can be determined by those of skill in the art.

The extinction coefficient of the material and its thickness, should be selected so that the reflection from layer 16a at a preselected wavelength, neglecting optical interference, should preferably be at least about thirty-five percent, with the remainder of light energy being absorbed and dissipated in the form of heat. Similarly, transmission through layer 16a at a preselected wavelength, neglecting optical interference, will preferably be at least about thirty-five percent.

It is to be understood that the extinction coefficient of layer 16a and its thickness can be selected so that the transmission through layer 16a at a preselected wavelength, neglecting optical interference, can be from about thirty percent to about forty percent. Overall, the amount of light transmitted through layer 16a, after two passes, should be substantially equal to the amount of light that is originally reflected from layer 16a, in order to achieve the appropriate destructive interference at the reflective surface of layer 16a, as will be understood by those of skill in the art.

Substantially transparent conducting layer 16b is made from indium tin oxide (ITO) and has a thickness of about eight-hundred-and-forty angstroms (840 Å). Other suitable materials and layer thicknesses can be used as will occur to those of skill in the art, such as zinc oxide (ZnO). The extinction coefficient of the material of layer 16b and its thickness is selected so that the transmission through layer 16b at a preselected wavelength, neglecting optical interference, is greater than about eighty percent, but is preferably at least about ninety percent. As known to those of skill in the art, it is generally preferred that the preselected wavelength(s) for layer 16b should be substantially equal to the preselected wavelengths used to choose layer 16a.

A wavelength of about five-hundred-and-fifty nanometers (550 nm), the centre of the spectrum of visible light, is a presently preferred preselected wavelength used for the purpose of determining appropriate thicknesses and materials of layers 12 and 14 and member 16, as the resulting device 10 can have the desired optical interference characteristics across the visible light spectrum. As will be understood by those of skill in the art, an incidental benefit to the selection of this wavelength can result in a device which reflects electromagnetic energy outside the visible spectrum, including infra-red, thus reducing the heating of the display. However, it will occur to those of skill in the art that other wavelengths can be selected, as desired.

Optical interference member 16 is also quantifiable in terms of its work function $\Phi_{OIM}$, or the amount of energy required to extract an electron from the surface of member 16. In a present embodiment, positive-charges or holes flow from current source 20 through anode 12 and into electroluminescent layer 14, where they combine with electrons which flow from current source 20 through cathode 18, optical interference member 16 and into electroluminescent layer 14. Thus, in order to facilitate the injection of electrons into the lowest unoccupied molecular orbital of layer 14, the materials chosen for member 16 are such that the difference X between $E_{LUMO}$ and $\Phi_{OIM}$, expressed as an absolute value, approaches zero. This expression can be expressed mathematically as:

$$X = |\Phi_{OIM} - E_{LUMO}|$$

$$\text{Where } \lim_{X \to 0}$$

In order for the difference X to approach zero, it is believed that the X can be in the range of from about 0.0 to about 1.5 electron-volts (eV). It is believed that the difference X can be in the range of from about 0.1 to about 1.3 electron-volts. More preferably, it is believed that the difference X should be in the range of from about 0.6 to about 1.0 electron-volts. In the present embodiment, where layer 16a is made from magnesium silver and layer 16b is made from indium tin oxide, the overall work function $\Phi_{OIM}$ of member 16 is about 3.6 electron-volts. As $E_{LUMO}$ is about 3.0 electron-volts, the difference X is about 0.6 electron-volts.

Cathode 18 is magnesium silver having a thickness of about five-hundred angstroms (500 Å), and in the present embodiment is reflective. In other embodiments, it is believed that cathode 18 can have a thickness between about two-hundred-and-fifty angstroms (250 Å) to about two-thousand-angstroms (2000 Å). However, it will occur to those of skill in the art that other suitable conducting materials and thicknesses can be used.

It now will be apparent that the thickness and material(s) of member 16 and its components can be determined with an operation that considers, at least in part, the thicknesses of and/or materials of anode 12, electroluminescent layer 14, and cathode 18.

Device 10 can be fabricated using techniques known in the art. In the foregoing embodiment, anode 12 is vacuum-deposited onto a glass substrate, and the subsequent layers are formed thereon also using vacuum deposition. The entire device 10 is then sealed using techniques known in the art. Other suitable substrates and means of fabricating device 10 will occur to those of skill in the art. For example, the substrate can be plastic. Further, where electroluminescent layer 14 is poly(n-vinyl carbozale), then spin-coating can be an appropriate fabrication technique for layer 14.

The operation of device 10 will now be discussed. It will be appreciated by those of skill in the art that the following is a simplified model for purposes of explanation, and that other physical phenomena occurring during the operation of device 10 are assumed, for the purposes of this discussion, to have a negligible influence on the operation. Current source 20 is 'on', so that holes are driven into electroluminescent layer 14 via anode 12. These holes then combine with electrons delivered into layer 14 from source 20, via cathode 18 and optical interference member 16. The fact that the difference between $E_{LUMO}$ and $\Phi_{OIM}$, expressed as an absolute value, approaches zero, reduces barriers to current flow through device 10, preventing or inhibiting breakdown of layer 14. The recombination of holes and electrons in layer 14 causes light to be emitted out through the front or exterior face of anode 12 and towards a viewer, as indicated by arrow $L_{em}$.

At the same time, ambient light is incident upon device 10, as indicated by arrow $L_{amb}$, and passes through anode 12 and electroluminescent layer 14. Ambient light $L_{amb}$ incident upon semi-absorbing layer 16a is partially reflected, partially absorbed and partially transmitted. The light transmitted through semi-absorbing layer 16a passes through transparent layer 16b, where it reflects off cathode 18 and back through transparent layer 16b, at which point this reflected light is inverted one-hundred-and-eighty degrees out of phase with the partially reflected light from layer 16a, and thus these two reflections destructively interfere and substantially cancel each other out. The energy otherwise found in these two reflections is absorbed by semi-absorbing layer 16a and cathode 18, where it is dissipated as a relatively small amount of heat. The result is that reflected light ($L_{ref}$) back towards the viewer from device 10 is reduced. In a present embodiment, reflected light ($L_{ref}$) is reduced by about ninety percent, compared to an electroluminescent device assembled without optical interference member 16.

It is believed that in other embodiments of the invention, reflected light ($L_{ref}$) can be reduced by as much as about 99.5 percent by choosing different materials, thicknesses and extinction coefficients for optical interference member 16 and by selected appropriate thicknesses and materials for the other layers in device 10, although still within the aforementioned acceptable parameters and ranges such that the difference between $E_{LUMO}$ and $\Phi_{OIM}$, expressed as an absolute value, approaches zero. However, while a higher difference in energy levels between $E_{LUMO}$ and $\Phi_{OIM}$, still within the acceptable ranges, can achieve reduced reflection, it can also result in reduced electrical efficiency in the current flow through device 10.

In other embodiments of the invention, a suitably modified optical interference member 16 can be disposed in series with other layers of device 10. Referring now to FIG. 2, an electroluminescent device in accordance with a second embodiment of the invention is indicated generally at 10a. Like components to those shown in FIG. 1 are indicated with like reference numbers. Device 10a comprises a electroluminescent transmitting anode 12, an optical interference member 16' disposed behind anode 12, an electroluminescent layer 14 disposed behind interference member 16', and a cathode 18 disposed behind electroluminescent layer 14. Device 10a is connected to a current source 20 via anode 12 and cathode 18 in order to drive a constant current through device 10 and layer 14.

Electroluminescent transmitting anode 12 is any conducting material which is transparent to at least a portion of emitted electroluminescent light, such as indium tin oxide (ITO) or zinc oxide (ZnO). In a present embodiment, anode 12 is a layer of indium tin oxide preferably having a thickness of about fifteen-hundred angstroms (1500 Å).

It is to be understood that electroluminescent transmitting anode 12 can have different thicknesses, and can be in the range of, for example, from about one-thousand angstroms (1000 Å) to about three-thousand angstroms (3000 Å), or from about twelve-hundred angstroms (1200 Å) to about two-thousand angstroms (2000 Å).

Electroluminescent layer 14 is an organic electroluminescent material such as tris(8-quinolinolato aluminum) (Alq3) or poly(n-vinyl carbozale) ($PVC_z$) wherein photons of light are emitted when electrons drop from a lowest unoccupied molecular orbital ("lumo") of layer 14, where they combine with holes in the highest occupied molecular orbital ("homo") of layer 14. Accordingly, a current flow through electroluminescent layer 14 can produce an emission of light. In a present embodiment, layer 14 is preferably made from tris(8-quinolinolato aluminum), preferably having a thickness of about one-thousand angstroms (1000 Å), although those of skill in the art will be able to select other appropriate thicknesses of this layer. As is known to those familiar with the electrical properties of tris(8-quinolinolato aluminum), the energy required to extract an electron from the highest occupied molecular orbital is about 5.4 electron-volts, which can also be described as the energy required to extract an electron from the surface of layer 14, or, the work function $E_{HOMO}$ of layer 14. Further, the energy required to extract an electron from the lowest unoccupied molecular orbital of tris(8-quinolinolato aluminum) is about 3.0 electron-volts, which can be referred to as $E_{LUMO}$. Thus the difference between $E_{HOMO}$ and $E_{LUMO}$ of tris(8-quinolinolato aluminum) is about 2.4 electron-volts. In other embodiments of the invention, other organic materials can be so chosen (i.e. by selection of material or modification of material with dopants) so that the difference between $E_{HOMO}$ and $E_{LUMO}$ is in the range from about 1.5 electron-volts to about 3.0 electron-volts, which covers the spectrum of visible light.

In a present embodiment optical interference member 16' comprises a substantially transparent conducting layer 16c made from indium tin oxide (ITO) and having a thickness of about seven-hundred-and-forty-five angstroms (745 Å). Other suitable materials can be used as will occur to those of skill in the art, such as zinc oxide (ZnO) or a suitable organic material. The indium tin oxide of layer 16c is modified (by controlling its stoichiometry) so that it behaves as a quarter-wave-stack at a light wavelength of five-hundred-and-fifty nanometers (550 nm), and chosen so that the transmission through layer 16c is greater than about eighty percent, and preferably at least about ninety percent. However, it will occur to those of skill in the art that other wavelengths can be selected, as desired.

As discussed previously, optical interference member 16' is also measurable in terms of work function $\Phi_{OIM}$. In a present embodiment, holes flow from current source 20 through anode 12 and optical interference member 16', and into electroluminescent layer 14, where they combine with electrons which flow from current source 20 through cathode 18 and into electroluminescent layer 14. Thus, in order to facilitate the extraction of electrons from the highest occupied molecular orbital of electroluminescent layer 14, the materials chosen for member 16' are such that the difference Y between $E_{HOMO}$ and $\Phi_{OIM}$, expressed as an absolute value, approaches zero. This expression can be expressed mathematically as:

$$Y = |\Phi_{OIM} - E_{HOMO}|$$

$$\text{Where } \lim_{Y \to 0}$$

In order for the difference between $E_{HOMO}$ and $\Phi_{OIM}$ to approach zero, it is believed that the difference Y can be in the range of from about 0.0 to about 1.5 electron-volts (eV). It is believed that the difference Y can be in the range of from about 0.1 to about 1.3 electron-volts. More preferably, it is believed that the difference Y should be in the range of from about 0.4 to about 1.0 electron-volts. In the present embodiment, where layer 16a is made from magnesium silver and layer 16b is made from indium tin oxide, the overall work function $\Phi_{OIM}$ of member 16 is about 5.0 electron-volts. Since $E_{HOMO}$ is about 5.4 electron-volts, the difference Y is about 0.4 electron-volts (eV).

Cathode 18 is magnesium silver having a thickness of about five-hundred angstroms (500 Å), and in the present embodiment is reflective. In other embodiments, it is believed that cathode 18 can have a thickness between about two-hundred-and-fifty angstroms (250 Å) to about two-thousand-angstroms (2000 Å). However, it will occur to those of skill in the art that other suitable conducting materials and thicknesses can be used.

It now will be apparent that the thickness and material(s) of member 16' and its components can be determined with an operation that considers, at least in part, the thicknesses of and/or materials of anode 12, electroluminescent layer 14, and cathode 18.

Device 10a can be fabricated using techniques known in the art. In the foregoing embodiment, anode 12 is vacuum-deposited onto a glass substrate, and the subsequent layers are formed thereon also using vacuum deposition. The entire device 10a is then sealed using techniques known in the art. Other suitable substrates and means of fabricating device 10a will occur to those of skill in the art. For example, the substrate can be plastic. Further, where electroluminescent layer 14 is poly(n-vinyl carbozale), then spin-coating can be an appropriate fabrication technique for layer 14.

The operation of device 10a will now be discussed. It will be appreciated by those of skill in the art that the following is a simplified model for purposes of explanation, and that other physical phenomena occurring during the operation of device 10a are assumed to have a negligible influence on the operation. Current source 20 is 'on', so that holes or positive-charges are driven into electroluminescent layer 14 via anode 12 and optical interference member 16. These positive-charges then combine with electrons delivered into layer 14 from source 20 via cathode 18. Because the difference between $E_{HOMO}$ and $\Phi_{OIM}$ approaches zero, barriers to current flow through device 10a are reduced, preventing or inhibiting breakdown of layer 14. The recombination of electrons and holes in layer 14 causes light to be emitted out through the front face of anode 12 and towards a viewer, as indicated by arrow $L_{em}$.

At the same time, ambient light is incident upon device 10a as indicated by arrow $L_{amb}$ and passes through anode 12 and is incident upon transparent layer 16c. About half of ambient light $L_{amb}$ incident upon layer 16c is reflected, while the remainder is transmitted. The light transmitted through layer 16c reflects off the surface of electroluminescent layer 14 and back through layer 16c. *Due to the quarter-wavelength thickness of layer 16c*, this reflected light from layer 14 is inverted one-hundred-and-eighty degrees out of phase with the reflected light from layer 16c, and thus these two reflections destructively interfere and substantially cancel each other out. The energy otherwise found in these two reflections is transmitted through layer 16c. The result is that reflected light ($L_{ref}$) back towards the viewer from device 10 is reduced. In the present embodiment, reflected light ($L_{ref}$) is believed to be reduced by a range of from about 0.5 percent to about two percent, compared to electroluminescent devices without layer 16'.

While only specific combinations of the various features and components of the present invention have been discussed herein, it will be apparent to those of skill in the art that desired sub-sets of the disclosed features and components and/or alternative combinations of these features and components can be utilized, as desired. For example, the embodiments discussed herein can be combined to provide multiple optical interference members disposed between different layers of the electroluminescent device, and therefore disjoined from each other, in order to further reduce reflectance from the device. For example, layer 16' and layer 16 can be included on respective sides of layer 14.

Furthermore, each optical interference member can be a transparent layer or a combination of a transparent layer and a semi-absorbing layer in order to achieve different results, and it will be apparent that these different types of optical interference members can also be placed at different locations throughout the device. For example, it is contemplated that a transparent layer, without a semi-absorbing layer can be used between the organic electroluminescent layer and the cathode, and similarly, a combination of a transparent layer and a semi-absorbing layer can be used between the anode and the electroluminescent layer, by having the difference between work function of the optical interference member and the energy required to extract an electron from either highest occupied molecular orbital, and/or the lowest unoccupied molecular orbital, approach zero, as appropriate.

The present invention can be suitable for a computer display. For example, a pixilated organic electroluminescent computer display can be formed where the anode comprises a plurality of generally parallel and spaced anodes to compose the front layer of an organic electroluminescent computer display, and the cathode comprises a number of spaced cathodes which are generally perpendicular to the anodes. It will be further understood that the anode and the cathode can be patterned in a variety of ways, other than pixilated, to create different recognizable patterns to a user of device 10. When such a display is pixilated or patterned, it will be appreciated that individual pixels or patterns can be fired using known techniques such as pulsed-DC, and/or adding a periodic reverse-polarity 'refresh' pulse to reduce built-up charge. The device can also be hybrid-display having an active matrix, as can be found in notebook computers.

In addition, the present invention can be suitably modified for use in colour organic electroluminescent devices. As known to those of skill in the art, such multi-colour and full-colour devices can be formed from stacked transparent organic electroluminescent layers. Where the optical interference member is between two of these stacked layers, it will be apparent that the difference between its work function and the energy level required to extract an electron from the lowest unoccupied molecular orbital of the electroluminescent layer nearest the anode should approach zero, and the difference between the work function and the energy level required to extract an electron from the highest occupied molecular orbital of the electroluminescent layer nearest the cathode should also approach zero. More preferably, the work function of the optical interference member should be the average of the lowest unoccupied molecular orbitals of the surrounding electroluminescent layers.

Multi-coloured and full-coloured devices can also be provided through a patterned red-green-blue organic layer (i.e. by selecting materials having inherent colour properties, or by appropriately doping the patterns on the layer). Other colourizing techniques can including the use of a white-emitter and appropriate filters. It will be apparent that the teachings of the present invention can be modified to accommodate these and other colour devices.

The present invention can be suitable for use as a backlight for a liquid crystal display.

It will also be understood that the present invention can be suitably modified for organic electroluminescent devices which have an electron transport layer between the cathode and the electroluminescent layer, and/or a hole transport layer between the anode and the electroluminescent layer. In this embodiment, the optical interference member can thus be placed between the transport layer and the electroluminescent layer, or the transport layer can be placed between the electroluminescent layer and the optical interference member. In this embodiment of the invention, it will be apparent that the optical interference member is still selected to have a work function such that the difference between the work function and the energy levels associated with the respective anode side and/or cathode side of the electroluminescent layer(s) approach zero, in order to facilitate current flow through the entire device. It is also contemplated that an appropriate transport layer can be incorporated into an optical interference member.

Furthermore, while the embodiments herein refer to a front anode and a rear cathode, it will be apparent that the present invention can be suitable to a device having a front cathode and a rear anode, as long at least the front layer is transparent to at least a portion of emitted electroluminescent light.

The present invention provides a novel organic electroluminescent device having an optical interference member which reduces the overall reflectance from the device. The optical interference member is selected to have a thickness which causes at least some destructive optical interference of ambient light incident on the display. In addition, the material(s) of the optical interference member are chosen to have a work function such that the difference between the work function and the energy level required to extract an electron from the highest occupied molecular orbital, or the lowest unoccupied molecular orbital of the electroluminescent layer approaches zero, depending on the direction of current flow and location of the optical interference member in relation to the electroluminescent layer. The appropriate selection of material for the optical interference member improves proper current flow through the device, thus reducing the likelihood of electrical breakdown of the organic electroluminescent layer and improving the overall energy efficiency of the device. Finally, in embodiments where a semi-absorbent layer and transparent layer are combined to form the optical interference member, then placement of such an optical interference member in contact with the electrode at the back of the device can actually increase the reflectance of infra-red ambient signatures, compared to absorbing films, thus reducing the heating of the display and reducing the likelihood of damage to the electroluminescent layer.

We claim:

1. An electroluminescent device for displaying an image to a viewer in front of said device, comprising:
    an anode layer;
    a cathode layer, at least one of said anode layer and said cathode layer being said front and being substantially transparent to electroluminescent light;
    an organic electroluminescent layer disposed between said cathode layer and said anode layer, said electroluminescent layer having a highest occupied molecular orbital associated with an anode side, and a lowest unoccupied molecular orbital associated with a cathode side; and
    an optical interference member for reducing the reflectance of ambient light towards said viewer, said member disposed between said anode layer and said cathode layer, said optical interference member having a work function, such that a first difference between said work function and a first energy level required to remove an electron from said highest occupied molecular orbital when said optical interference member is at said anode side approaches zero, and a second difference between said work function and a second energy level required to remove an electron from said lowest unoccupied molecular orbital when said optical interference member is at said cathode side approaches zero.

2. The device according to claim 1 wherein said first difference is from about zero electron-volts to about 1.5 electron-volts.

3. The device according to claim 1 wherein said first difference is from about 0.1 electron-volts to about 1.3 electron-volts.

4. The device according to claim 1 wherein said first difference is from about 0.4 electron-volts to about one electron-volt.

5. The device according to claim 1 wherein said first energy level is about 5.4 electron-volts and said work function is about 5.0 electron-volts.

6. The device according to claim 1 wherein said second difference between said work function and said second energy characteristic is from about zero electron-volts to about 1.5 electron-volts.

7. The device according to claim 1 wherein said second difference is from about 0.1 electron-volts to about 1.3 electron-volts.

8. The device according to claim 1 wherein said second difference is from about 0.6 electron-volts to about one electron-volt.

9. The device according to claim 1 wherein said second energy level is about 3.0 electron-volts and said work function is about 3.6 electron-volts.

10. The device according to claim 1 wherein said organic electroluminescent layer is tris(8-quinolinolato aluminum).

11. The device according to claim 1 wherein said organic electroluminescent layer is poly(n-vinyl carbozale).

12. The device according to claim 1 wherein said optical interference member is between said electroluminescent layer and said cathode.

13. The device according to claim 1 wherein said optical interference member comprises a semi-absorbent layer and a transparent layer.

14. The device according to claim 13 wherein said semi-absorbent layer is magnesium silver and said transparent layer is indium tin oxide, said optical interference member having a work function of 3.6 electron-volts.

15. The device according to claim 1 wherein said optical interference member is between said anode and said electroluminescent layer.

16. The device according to claim 1 wherein said optical interference member comprises a transparent layer.

17. The device according to claim 16 wherein said transparent layer is made from indium tin oxide.

18. The device according to claim 1 further comprising at least one additional optical interference member disposed between said anode layer and said cathode layer and disjoined from said optical interference member.

19. The device according to claim 1 further comprising at least one additional organic electroluminescent layer disposed between said cathode layer and said anode layer.

20. The device according to claim 19 wherein said optical interference member is between two of said electroluminescent layers.

21. The device according to claim 1 wherein said device is a patterned organic electroluminescent computer display.

22. The device according to claim 21 wherein said device is pixilated and said anode comprises a plurality of generally parallel anodes and said cathode comprises a plurality of cathodes that are generally perpendicular to each of said plurality of generally parallel anodes.

23. The device according to claim 1 wherein said device is a colour electroluminescent display.

24. The device according to claim 1 further comprising an electron transport layer between said cathode layer and said electroluminescent layer.

25. The device according to claim 1 further comprising a hole transport layer between said anode layer and said electroluminescent layer.

26. The device according to claim 25 wherein said hole transport layer is incorporated into said optical interference member.

27. An optical interference electroluminescent device for displaying an image to a viewer in front of said device, comprising:

an anode layer;

a cathode layer, at least one of the anode layer and the cathode layer being substantially transparent to at least a portion of emitted electroluminescent light;

at least one organic electroluminescent layer disposed between said anode layer and said cathode layer, said electroluminescent layer having a first energy characteristic being the amount of energy required to extract an electron from a highest occupied molecular orbital of said electroluminescent layer, and a second energy characteristic being the amount of energy required to extract an electron from a lowest unoccupied molecular orbital of said electroluminescent layer; and at least one optical interference member disposed between two of said layers, and having a work function substantially equal to said first energy characteristic when said optical interference member is between said anode and said electroluminescent layer, and having a work function substantially equal to said second energy characteristic when said optical interference member is between said cathode and said electroluminescent layer, said optical interference member being of a thickness and material such that the spectral reflectance of said electroluminescent device is so modified that the reflectance of ambient light by said electroluminescent device towards said viewer is reduced.

28. An electroluminescent device to emit light in a selected spectrum, comprising:

an anode layer a cathode layer, one of said anode layer and said cathode layer being substantially transparent to at least a portion of said selected spectrum emitted by said electroluminescent device;

an organic electroluminescent layer between said anode layer and said cathode layer, said electroluminescent layer having a highest occupied molecular orbital respective to said anode layer and having a lowest unoccupied molecular orbital respective to said cathode layer; and an optical interference member having a selected work function and operable to reduce ambient light reflected through said transparent layer, said optical interference member being between said electroluminescent layer and one of said anode layer and said cathode layer, wherein the difference between said selected work function and an energy level required to extract an electron from a respective molecular orbital approaches zero.

* * * * *